US011615029B2

(12) United States Patent
Wu et al.

(10) Patent No.: US 11,615,029 B2
(45) Date of Patent: Mar. 28, 2023

(54) FULL MULTI-PLANE OPERATION ENABLEMENT

(71) Applicant: Micron Technology, Inc., Boise, ID (US)

(72) Inventors: Jiangang Wu, Boise, ID (US); Qisong Lin, Boise, ID (US); Jung Sheng Hoei, Boise, ID (US); Yunqiu Wan, Boise, ID (US); Ashutosh Malshe, Boise, ID (US); Peng-Cheng Chen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 428 days.

(21) Appl. No.: 16/730,881

(22) Filed: Dec. 30, 2019

(65) Prior Publication Data
US 2021/0200682 A1   Jul. 1, 2021

(51) Int. Cl.
| | |
|---|---|
| *G06F 11/00* | (2006.01) |
| *G06F 12/0891* | (2016.01) |
| *G06F 12/0811* | (2016.01) |
| *G06F 12/02* | (2006.01) |
| *G06F 12/0882* | (2016.01) |
| *G06F 11/14* | (2006.01) |
| *G11C 16/06* | (2006.01) |
| *G06F 13/16* | (2006.01) |

(52) U.S. Cl.
CPC ......... *G06F 12/0891* (2013.01); *G06F 11/14* (2013.01); *G06F 12/0246* (2013.01); *G06F 12/0811* (2013.01); *G06F 12/0882* (2013.01); *G06F 13/1668* (2013.01); *G11C 16/06* (2013.01)

(58) Field of Classification Search
CPC ..................................................... G06F 11/14
See application file for complete search history.

(56) References Cited

U.S. PATENT DOCUMENTS

| | | | | |
|---|---|---|---|---|
| 7,561,466 | B2 * | 7/2009 | Roohparvar | G06F 11/1068 |
| | | | | 365/185.09 |
| 8,572,311 | B1 * | 10/2013 | Shalvi | G11C 29/52 |
| | | | | 711/103 |
| 8,938,580 | B2 * | 1/2015 | Cheriton | G11C 15/00 |
| | | | | 365/49.1 |
| 9,502,139 | B1 * | 11/2016 | Cheriton | G06F 11/1469 |
| 9,778,863 | B2 * | 10/2017 | Agarwal | G06F 3/0619 |
| 10,771,091 | B2 * | 9/2020 | Yang | H03M 13/098 |

(Continued)

*Primary Examiner* — Amine Riad
(74) *Attorney, Agent, or Firm* — Holland & Hart, LLP

(57) ABSTRACT

Methods, systems, and devices for full multi-plane operation enablement are described. A flash controller can determine that a first plane of a set of planes of a memory die is an invalid plane. The flash controller can issue a single descriptor associated with a multi-plane operation for the set of planes of the memory die. The single descriptor can include a plurality of commands for the multi-plane operation in which the first command of the plurality of commands can be a duplicate of a second command of the plurality of commands based on the first plane being the invalid plane. In some cases, a negative-and (NAND) controller can receive the single descriptor associated with the multi-plane operation for the set of planes of a memory die. The NAND controller can issue a plurality of commands for the multi-plane operation based on receiving the single descriptor.

20 Claims, 6 Drawing Sheets

(56) References Cited

U.S. PATENT DOCUMENTS

| | | | | |
|---|---|---|---|---|
| 10,832,789 B1* | 11/2020 | Gupta | ................... | G11C 16/10 |
| 11,095,313 B2* | 8/2021 | Montoye | ............... | H03M 13/19 |
| 2014/0281138 A1* | 9/2014 | Karamcheti | ........ | G06F 11/2058 |
| | | | | 711/160 |
| 2019/0251029 A1* | 8/2019 | Steinmacher-Burow | ................... | |
| | | | | G06F 12/0817 |
| 2019/0361614 A1* | 11/2019 | Natarajan | ............. | G06F 3/0659 |

\* cited by examiner

FULL MULTI-PLANE OPERATION ENABLEMENT

TECHNICAL FIELD

The following relates generally to a memory sub-system and more specifically to full multi-plane operation enablement for a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
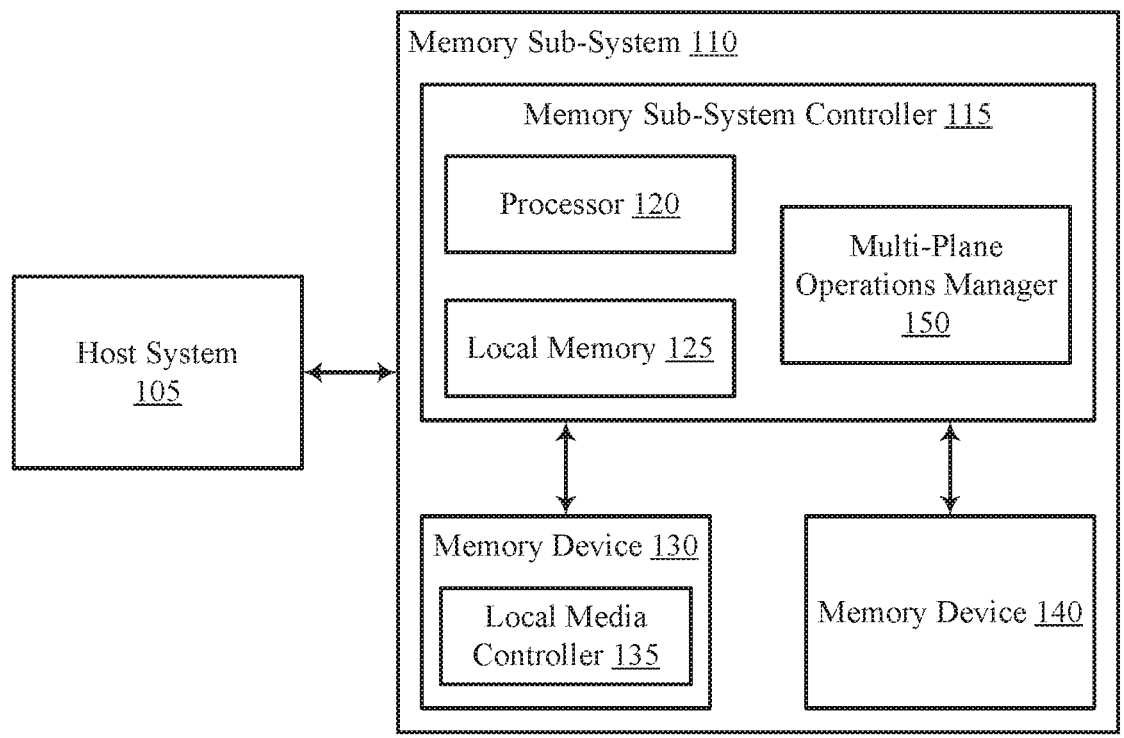
FIG. 1 illustrates an example of a computing system that includes a memory sub-system in accordance with some examples of the present disclosure.

Aspects of the present disclosure are directed to full multi-plane operation enablement. A memory sub-system can be a storage device, a memory module, or a hybrid of a storage device and memory module. Examples of storage devices and memory modules are described herein in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device, A non-volatile memory device is a package of one or more dice, One example of non-volatile memory devices is a negative-and (NAND) memory device. Other examples of non-volatile memory devices are described below in conjunction with FIG. 1. The dice in the packages can be assigned to one or more channels for communicating with a memory sub-system controller. Each die can consist of one or more planes. Planes can be groups into logic units (LIN). For some types of non-volatile memory devices (e.g., NAND memory devices), each plane consists of a set of physical blocks, which are groups of memory cells to store data. A cell is an electronic circuit that stores information. A data block hereinafter refers to a unit of the memory device used to store data and can include a group of memory cells, a word line group, a word line, or individual memory cells.

Multiple cells can be strung together, and strings can be replicated multiple times within a single block. Each column of cells can be referred to as a "string" and each row can be referred to as a "page." Multiple strings and pages of cells can collectively be referred to as a "block." A block of data can include pages with valid data, and pages that contain no data (e.g., pages that have been previously erased but not yet written). The valid data can then be written (e.g., rewritten) to the memory device (e.g., to a different page of the memory device).

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system.

The data to be read or written, as specified by a host request, is hereinafter referred to as "host data", A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version e.g. used to distinguish age of data written), valid bitmap (which LBAs or logical transfer units contain valid data), etc.

When host data can be written to the memory cells, multiple blocks across multiple memory dies and channels can be used. In some cases, a block of data across the multiple memory dies and channels can include pages or planes with invalid data. Blocks may be invalidated responsive to occurrence of various events that make the blocks unreliable. For example, a block may be invalidated responsive to a corresponding bit error rates (BER) exceeding a threshold BER. The block of data including pages or planes with invalid data can be referred to as a bad block. A bad block hereinafter refers to block that is no longer reliable for storing or retrieving data, for example, due to a defect (e.g., manufacturing defect) or due to wear. In some cases, the bad block cannot be accessed to replace the invalid data with valid data. For example, the bad block cannot be erased, programmed, or read. In such cases, groups of blocks cannot be programmed, erased, or read in parallel if at least one of the groups of blocks contains a bad block.

In conventional systems, a multi-plane operation that contains at least one bad block can perform the multi-plane operation by utilizing one plane operation at a time. In order to implement a full multi-plane operation in conventional systems, a command and descriptor for each plane can be issued. For example, because the bad block cannot be accessed, a memory sub-system controller can issue individual descriptors to avoid the bad block. The descriptor can include the address and command sequence. For example, a descriptor for the bad block can be issued, and a different descriptor for each remaining block (e.g., the good blocks, such as those that contain valid data) can be issued. In conventional systems, issuing a different descriptor for each command can increase overhead due to multiple parameters utilized by the controller, decrease performance of a memory sub-system, and increase the latency of the memory die.

Aspects of the present disclosure address the above and other deficiencies by having a memory sub-system that enables a full multi-plane operation. For example, a controller can issue a single descriptor for the multi-plane operation. The single descriptor can include multiple commands for the multi-plane operation. In some cases, the multiple commands can include commands associated with good blocks, and if a command is associated with a bad block, the controller can identify the bad block, duplicate the command associated with the good block, and replace the command of the bad block with the command of the good block. Because the bad block cannot be accessed, the command sequence of the bad block can be replaced by a command sequence of a good block and by replacing the command of the had block with the command of the good block, the controller can issue a single descriptor to perform a program, erase, or read operation in parallel with other groups of blocks (i.e., a single descriptor can be used to perform operations on multiple blocks or groups of blocks).

By issuing a single descriptor for multiple commands, the overall performance of the memory sub-system can be increased. For example, enabling a full multi-plane operation can improve the overall efficiency of the memory sub-system by decreasing the resource cost and time associated with accessing multiple descriptors from memory and increasing the performance of the memory sub-system. Such techniques can result in the memory sub-system experiencing improved read, write, and erase speeds and/or reduced power consumption, improved processing times, and the like Features of the disclosure are initially described in the context of a computing environment as described with reference to FIG. 1. Features of the disclosure are described in the context of method, block diagrams, and example memory dies as described with reference to FIGS. 2 through 5. These and other features of the disclosure are further illustrated by and described with reference to a computer system that relates to full multi-plane operation enablement as described with reference to FIG. 6.

FIG. 1 illustrates an example of a computing system 100 in accordance with examples as disclosed herein. The computing environment can include a host system 105 and a memory sub-system 110. The memory sub-system 110 can include media, such as one or more non-volatile memory, devices (e.g., memory device(s) 130), one or more volatile memory devices (e.g., memory device(s) 140), or a combination thereof.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile DIMM (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 105 that is coupled with one or more memory sub-systems 110. In some examples, the host system 105 is coupled with different types of memory sub-systems 110. FIG. 1 illustrates one example of a host system 105 coupled with one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 105 can be coupled to the memory sub-system 110 using a physical host interface. Examples of a physical host interface include, but are not limited to, a serial advanced technology attachment (SATA) interface, a peripheral component interconnect express (PCIe) interface. USB interface, Fiber Channel, Small Computer System Interface (SCSI), Serial Attached SCSI (SAS), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 105 and the memory sub-system 110. The host system 105 can further utilize a non-volatile memory Express (NVMe) interface to access the memory components (e.g., memory device(s) 130) when the memory sub-system 110 is coupled with the host system 105 by the PCIe interface. The physical host interface can provide an interface for passing control, address, data, and other signals between the memory sub-system 110 and the host system 105. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device(s) 140) can be, but are not limited to, random access memory (RAM), such as dynamic RAM (DRAM) and synchronous DRAM (SDRAM).

Some examples of non-volatile memory devices (e.g., memory device(s) 130) includes a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric RAM (FeRAM), magneto RAM (MRAM), Spin Transfer Torque (STT)-MRAM, conductive bridging RAM (CBRAM), resistive random access memory (RRAM), oxide based FRAM ((MUM), negative-or (NOR) flash memory, and electrically erasable programmable ROM (EE-PROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), a digital signal processor (DSP)), or other suitable processor.

The memory sub-system controller 115 can include a processor 120 (e.g., a processing device) configured to execute instructions stored in a local memory 125. In the illustrated example, the local memory 125 of the memory sub-system controller 115 includes an embedded memory configured to store instructions for performing various processes, operations, logic flows, and routines that control operation of the memory sub-system 110, including handling communications between the memory sub-system 110 and the host system 105.

In some examples, the local memory 125 can include memory registers storing memory pointers, fetched data, etc. The local memory 125 can also include ROM for storing micro-code. While the example memory sub-system 110 in FIG. 1 has been illustrated as including the memory sub-system controller 115, in another example of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 105 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between logical address (e.g., logical block address (IBA), namespace) and a physical address (e.g., physical block address) that are associated with the memory devices 130. The memory sub-system controller 115 can further include host interface circuitry to communicate with the host system 105 via the physical host interface. The host interface circuitry can convert the commands received from the host system into command instructions to access the memory devices 130 as well as convert responses associated with the memory devices 130 into information for the host system 105.

The memory sub-system 110 can also include additional circuitry or components that are not illustrated. In some examples, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some examples, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The local media controller 135 can receive a single descriptor associated with a multi-plane operation for a set of planes of a memory die. Based on receiving the single descriptor, the local medical controller 135 can issue multiple commands for the multi-plane operation. The single descriptor can indicate the multiple commands, and the multiple commands can include a first command and a second command where the first command can be a duplicate of the second command.

The memory sub-system 110 includes a multi-plane operations manager 150 that can determine that a first plane of a set of planes is an invalid plane. For example, the invalid plane can be associated with a hardware error, a block error, a memory component error, or a combination thereof. Additionally or alternatively, the invalid plane can include a broken plane, invalid data, errors that cannot be corrected, or a combination thereof. In some examples, the invalid plane cannot be accessed by the memory sub-system.

In some examples, the multi-plane operations manager 150 can issue a single descriptor associated with the multi-plane operation. The single descriptor can include multiple commands for the multi-plane operation. A first command included in the single descriptor can be a duplicate of a second command where the second command corresponds to a valid plane (e.g., a second plane). In such cases, the valid plane can be accessed by the memory sub-system. By issuing a single descriptor, the overhead is reduced by accessing a single command rather than a descriptor for each command, thereby improving performance and reliability.

In some examples, the memory sub-system controller 115 includes at least a portion of the multi-plane operations manager 150. For example, the memory sub-system controller 115 can include a processor 120 (e.g., a processing device) configured to execute instructions stored in local memory 125 for performing the operations described herein. In some examples, the multi-plane operations manager 150 is part of the host system 105, an application, or an operating system.

The multi-plane operations manager 150 can replace an address of the invalid plane with an address of the valid plane based on determining that the first plane is the invalid plane. In some cases, the multi-plane operations manager 150 can determine that more than one invalid plane is included in the multiple planes. In such cases, the multi-plane operations manager 150 can replace each address of the invalid planes with an address of the valid plane. Further details with regards to the operations of the multi-plane operations manager 150 are described herein.

Figure 2:
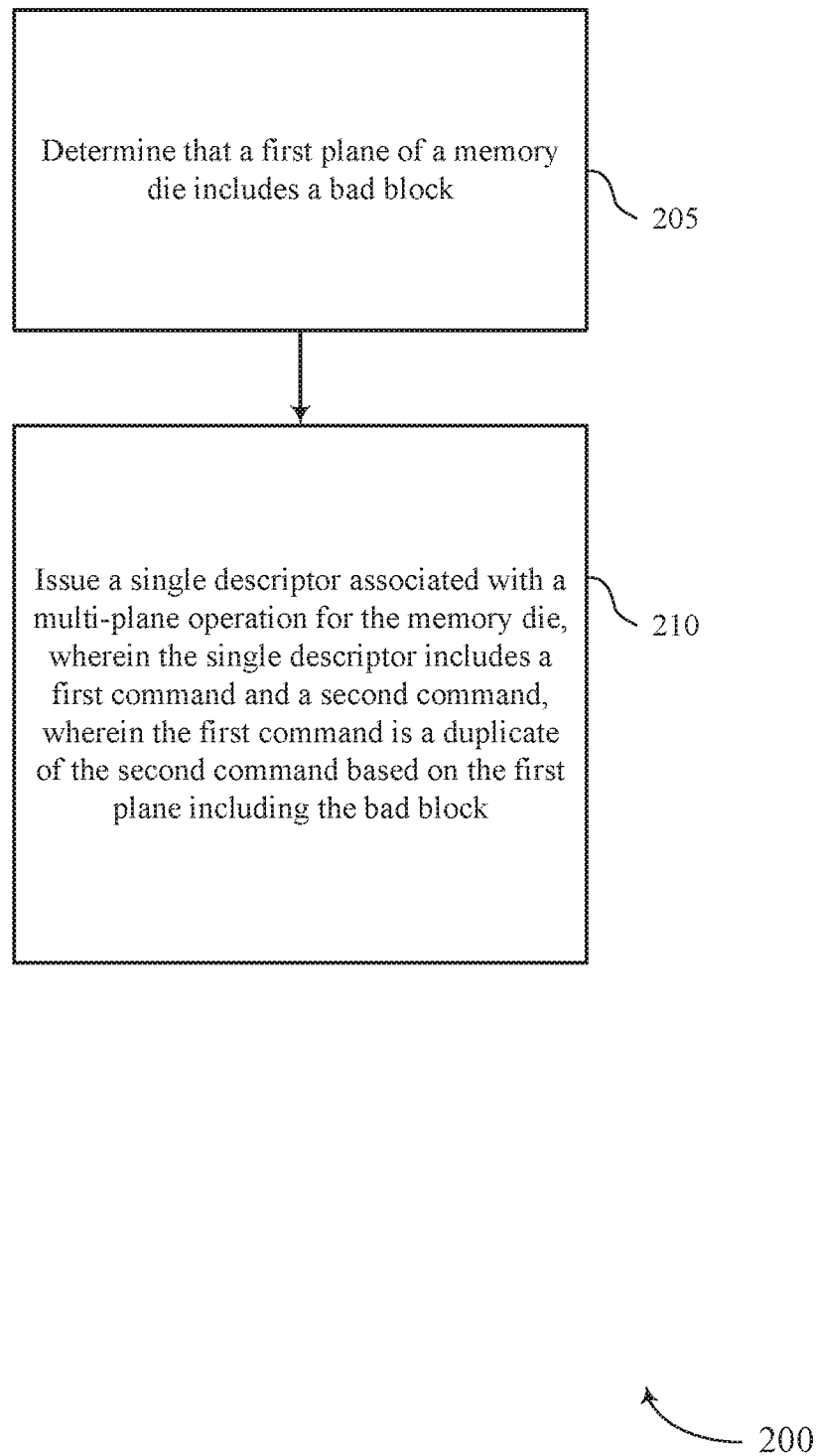
FIG. 2 is a diagram of an example method that supports full multi-plane operation enablement for memory in accordance with some examples of the present disclosure.

FIG. 2 is a diagram of an example method 200 that supports full multi-plane operation enablement in accordance with some examples of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some examples, the method 200 is performed by the multi-plane operations manager 150 of FIG. 1. Although shown in a particular sequence or order, unless otherwise specified, the order of the processes can be modified. Thus, the illustrated examples should be understood only as examples, and the illustrated processes can be performed in a different order, and some processes can be performed in parallel. Additionally, one or more processes can be omitted in various examples. Thus, not all processes are required in every example. Other process flows are possible.

At operation 205, the processing device of a flash controller can determine that a first plane of a memory die includes a bad block (e.g., an invalid plane). The bad block can be included in the invalid plane of the memory die. In some examples, the invalid plane can be a result of a hardware error, a broken plane, block errors, memory component failure, or a combination thereof. In such cases, the invalid plane can include errors that cannot be corrected. In some cases, determining that the first plane is the bad block can be based on the first plane containing an amount of invalid data, the first plane exceeding a threshold number of invalid pages of the memory die, or both. In some examples, the flash controller can be an example of the memory sub-system controller 115 as described with reference to FIG. 1. In some examples, aspects of the operations of 205 can be performed by multi-plane operations manager 150 as described with reference to FIG. 1.

At operation 210, the processing device can issue a single descriptor associated with a multi-plane operation for the memory die, wherein the single descriptor includes a first command and a second command, wherein the first command is a duplicate of the second command based on the first plane including the bad block. For example, the single descriptor can be issued to a local memory controller of the memory die. In some cases, the single descriptor can include a plurality of commands (e.g., including at least a first command and a second command) for the multi-plane operation. In such cases, the first command can be a duplicate of the second command based on the first plane including the bad block. In some cases, the second command can be for a second plane included in the set of planes. In such cases, the second command can correspond to a valid plane. In some examples, the second command can correspond to the second plane different from the first plane.

In some examples, the method 200 can include replacing an address of the first plane (e.g., bad block) with an address of the second plane (e.g., good block). In such cases, the second plane of the set of planes can be a valid plane. In some cases, the valid plane can include valid data. In such cases, determining that the second plane is the valid plane is based on the second plane containing an amount of valid data.

In some examples, the method 200 can include determining a number of invalid planes (e.g., bad blocks) of the set of planes and replacing addresses for each of the number of invalid planes with an address associated with a valid plane. The addresses can be replaced in a multi-plane command sequence indicated by the single descriptor. In some examples, the method 200 can include duplicating the second command based on the first plane being the invalid plane. In such cases, the first command (e.g., address) can be replaced with the second command.

In some examples, the single descriptor can contain only commands for valid planes of the set of planes. In some examples, the plurality of commands can be associated with at least one of a read operation, a write operation, or an erase operation. In some examples, aspects of the operations of 210 can be performed by multi-plane operations manager 150 as described with reference to FIG. 1.

Figure 3:
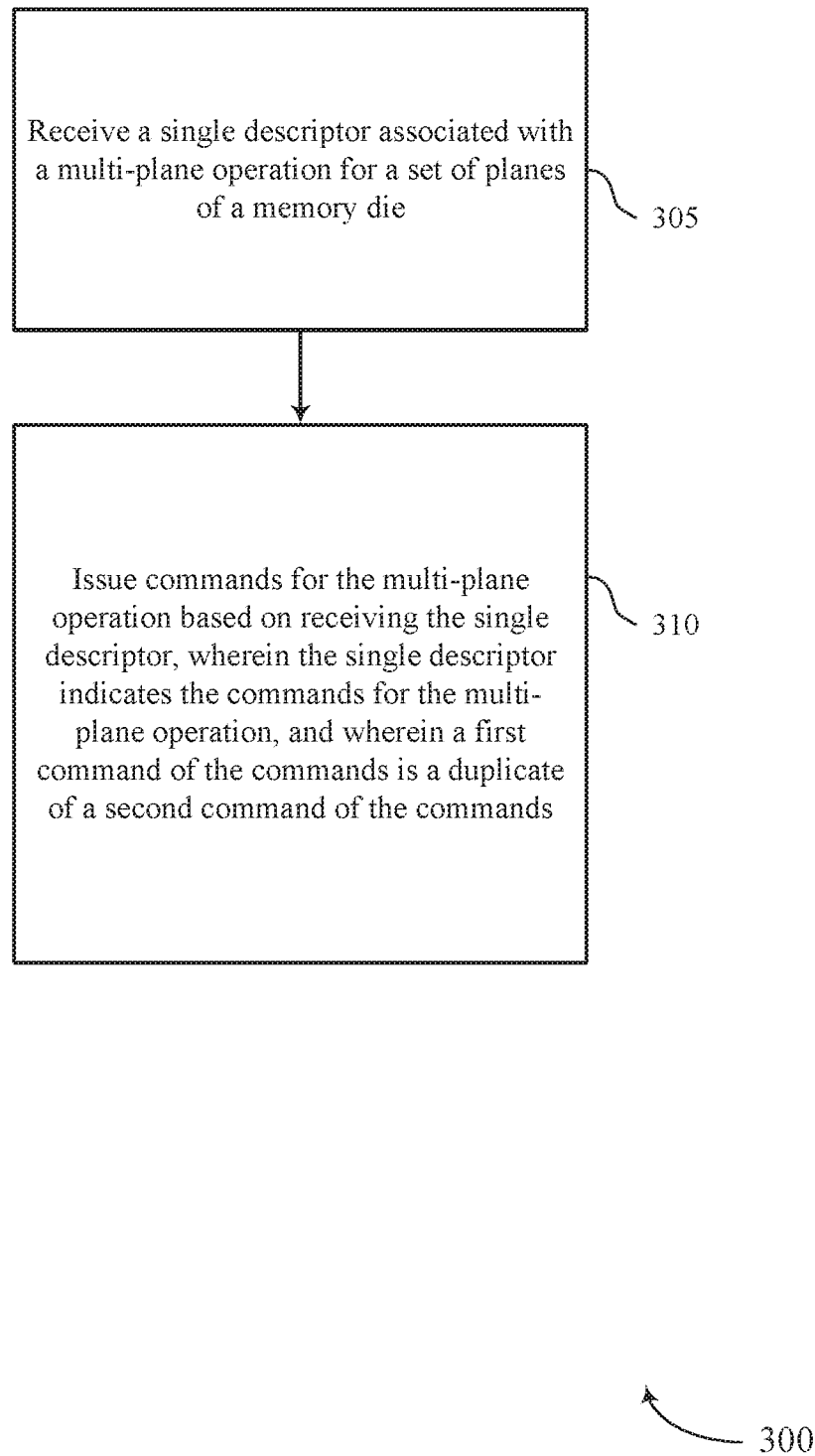
FIG. 3 is a diagram of an example method that supports full multi-plane operation enablement for memory in accordance with some examples of the present disclosure.

FIG. 3 is a diagram of an example method 300 that supports full multi-plane operation enablement in accordance with some examples of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some examples, the method 300 is performed by the multi-plane operations manager 150 of FIG. 1. Although shown in a particular sequence or order, unless otherwise specified, the order of the processes can be modified. Thus, the illustrated examples should be understood only as examples, and the illustrated processes can be performed in a different order, and some processes can be performed in parallel. Additionally, one or more processes can be omitted in various examples. Thus, not all processes are required in every example. Other process flows are possible.

At operation 305, the processing device of a NAND controller can receive a single descriptor associated with a multi-plane operation for a set of planes of a memory die. In some examples, the NAND controller can be an example of the local media controller 135 as described with reference to FIG. 1. In some examples, aspects of the operations of 305 can be performed by multi-plane operations manager 150 as described with reference to FIG. 1.

At operation 310, the processing device can issue commands for the multi-plane operation based on receiving the single descriptor, wherein the single descriptor indicates the commands for the multi-plane operation, and wherein a first command of the commands is a duplicate of a second command of the commands. In some cases, the commands can be associated with at least one of a read operation, a write operation, or an erase operation.

In some examples, the method 300 can include issuing the first command for a second plane. The first command can correspond to the first plane where the first plane is an invalid plane. In some examples, the second plane can correspond to the second command where the second plane is a valid plane. In such cases, the second command can be duplicated for the first command based on a first plane being an invalid plane, the first plane containing an amount of invalid data, exceeding a threshold number of invalid pages of the memory die, or both. The invalid plane can be a result of a hardware error, a broken plane, block errors, memory component failure, or a combination thereof. In such cases, the invalid plane can include errors that cannot be corrected. In some cases, the invalid plane can include invalid data (e.g., a bad block). In some cases, the valid plane can include invalid data (e.g., a good block).

In some cases, the first plane and the second plane can be included in a set of planes. In some examples, the method 300 can issue the second command for the second plane. In such cases, the first command can be the duplicate of the second command. In some examples, the second command can correspond to the second plane that is different from the first plane. In some examples, aspects of the operations of 310 can be performed by multi-plane operations manager 150 as described with reference to FIG. 1.

Figure 4:
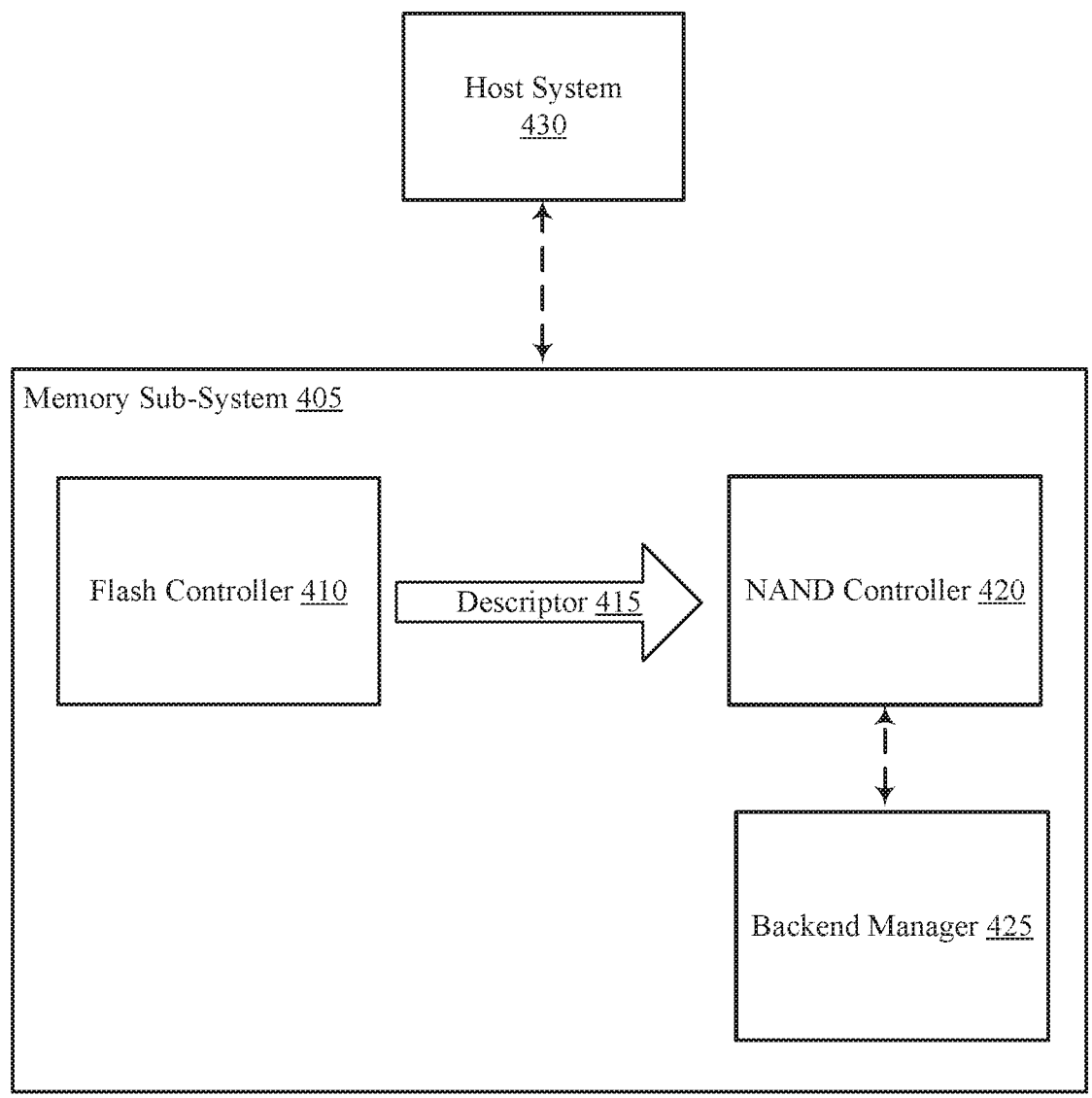
FIG. 4 is a block diagram of an example system that supports full multi-plane operation enablement for memory in accordance with some examples of the present disclosure.

FIG. 4 is a block diagram of an example system that supports full multi-plane operation enablement for memory in accordance with some examples of the present disclosure. The block diagram 400 can include memory sub-system 405. Memory sub-system 405 can include flash controller 410, NAND controller 420, and backend manager 425. The block diagram 400 can also include host system 430. The flash controller 410 can be an example of the memory sub-system controller 115 as described with reference to FIG. 1. The NAND controller can be an example of the local media controller 135 as described with reference to FIG. 1.

The memory sub-system 405 can perform a multi-plane operation. For example, the memory sub-system 405 can perform a 4-plane operation. In some cases, one or more planes of the four planes can be an invalid plane. The flash controller 410 can determine that a plane of the set of planes is a valid plane and that a different plane of the set of planes is an invalid plane. In order to perform a 4-plane operation on a memory die with an invalid plane, the flash controller 410 can duplicate a command sequence of a valid plane and replace the command sequence of the invalid plane with the duplicated command sequence. For example, the flash controller 410 can replace an address within a command for the invalid plane with an address of the valid plane. In some cases, a number of times the flash controller 410 can duplicate the command sequence for the valid plane is the same as the number of invalid planes in the set of planes. For example, if the memory die contains two invalid planes, then the flash controller 410 can duplicate the command sequence of the valid plane twice and replace each address of the two invalid planes with the address of the valid plane.

The flash controller 410 can confirm that the duplicated command sequence for the invalid plane is the same as the command sequence of the valid plane. In such cases, the address (e.g., data) of the invalid plane can be the same as the address of the valid plane. In some cases, the data can be disorganized within the row address; however, the flash controller 410 can read back the data, confirm that the data is disorganized within the row address, and confirm that the data is the same as the duplicated data. In some cases, the disorganized data can be associated with the row address.

The flash controller 410 can issue a single descriptor 415 associated with the multi-plane operation (e.g., 4-plane operation). The descriptor 415 can indicate multiple commands associated with the multi-plane operation. For example, the descriptor 415 can indicate the command associated with the valid plane and the command associated with the invalid plane. In such cases, the command associated with the invalid plane can be a duplicated command associated with the valid plane.

In some examples, the descriptor 415 can include the command and the row address. For example, the descriptor 415 can include an address of the channel and an address of the memory die within the row address. In some examples, the descriptor 415 can connect the data associated with the buffer to the descriptor 415. The descriptor 415 can be used to generate the command sequence (e.g., duplicate the command sequence of the valid plane and replace the command sequence of the invalid plane with the command sequence of the valid plane). In such cases, the descriptor 415 includes the syntax of the command that can be sent to the NAND controller 420.

In some cases, the descriptor 415 cannot be stored in the memory of the flash controller 410, thereby increasing the overhead associated with accessing the descriptor 415. For example, the descriptor 415 can be stored in the SRAM memory. In some memory sub-systems, accessing more than one descriptor 415 for a single multi-plane operation can increase the overhead, time, and resources associated with retrieving multiple descriptors from the SRAM memory. Rather, accessing a single descriptor 415 for the single multi-plane operation can decrease the overhead, time, and resources associated with retrieving the single descriptor.

The flash controller 410 can send a single command using the single descriptor 415 that instructs the NAND controller 420 to perform the 4-plane operation. The single command can outline four planes within the memory die where at least one of the four planes is an invalid plane. In such cases, the command can include duplicated data of at least one of the valid planes and replace the address of the invalid plane with the address of the valid plane.

The flash controller 410 can send the descriptor 415 to the NAND controller 420. In such cases, the NAND controller 420 can receive the descriptor 415 and issue the commands included in the descriptor 415. The NAND controller 420 can include a microcode configured to receive the command sequence included in the descriptor 415. When the NAND controller 420 receives the command sequence, the microcode can issue the command associated multi-plane operation. In some cases, the microcode can utilize a single plane of data (e.g., the last plane of data in the command sequence) to issue the command associated with the multi-plane operation. In some examples, the NAND controller 420 can issue a command to each plane e.g., the valid plane and the invalid plane). The commands can be associated with a read operation, a write operation, or an erase operation.

Figure 5A:
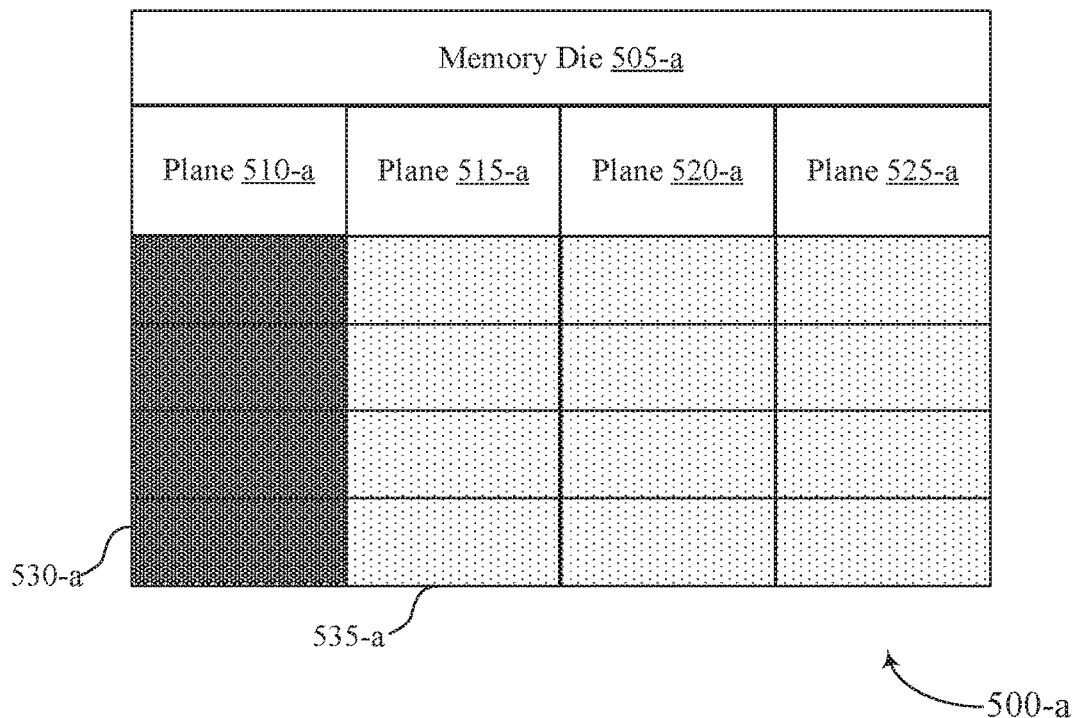
FIG. 5A is an example memory sub-system that supports full multi-plane operation enablement for memory in accordance with some examples of the present disclosure.

FIG. 5A is an example memory sub-system 500-a that supports full multi-plane operation enablement for memory in accordance with some examples of the present disclosure. The memory sub-system 500-a can include a memory die 505-a where the memory die 505-a can include a plane 510-a, a plane 515-a, a plane 520-a, and a plane 525-a. Each plane can include a block of data. For example, the plane 510-a includes block of data 530-a, and the plane 515-a includes block of data 535-a.

The memory die 505-*a* can be an example of a memory die 505-*a* that includes a single invalid plane (e.g., the plane 510-*a*). The memory die 505-*a* can include valid planes (e.g., the plane 515-*a*, the plane 520-*a*, and the plane 525-*a*). The plane 510-*a* can prevent the memory die 505-*a* from performing a multi-plane operation using a single descriptor due to the presence of invalid data within the block of data 530-*a*. In some cases, at least one block of data 530-*a* that includes invalid data can result in the plane 510-*a* being an invalid plane. The invalid plane can experience a hardware error, a block error, a memory component error, or a combination thereof. In some cases, the invalid plane can include a broken plane, invalid data, errors that cannot be corrected, or a combination thereof.

In some examples, the flash controller can duplicate a command associated with one of the valid planes and replace a command of the invalid plane with the duplicated command of the valid plane. For example, the command of the plane 515-*a* can be duplicated. The command of the plane 510-*a* can be replaced with the command of the plane 515-*a*. In some cases, a command of the plane 520-*a* and a command of the plane 525-*a* can be duplicated and the command of the plane 510-*a* can be replaced with either the command of the plane 520-*a* or the command of the plane 525-*a*. Table illustrates the command sequences for a 3-plane program operation.

TABLE 1

| Command Sequence | Description |
| --- | --- |
| 1. Issue PROGRAM PAGE MULTI-PLANE (85 h/80 h-11 h) with Plane 0 page data<br>2. wait tDBSY<br>1. Issue PROGRAM PAGE MULTI-PLANE (85 h/80 h-11 h) with Plane 0 page data<br>2. wait tDBSY<br>1. Issue PROGRAM PAGE MULTI -PLANE (85 h/80 h-11 h) with Plane 1 page data<br>2. wait tDBSY<br>1. Issue PROGRAM PAGE MULTI-PLANE (85 h/80 h-10 h) with Plane 2 page data<br>2. wait tDBSY | Descriptor #1 |

In some cases, the command "Issue PROGRAM PAGE MULTI-PLANE (85h/80h-11h) with Plane 0 page data" can be associated with the plane 515-*a*, In such cases, the command can be duplicated, and the command of the plane 510-*a* can be replaced with "Issue PROGRAM PAGE MULTI-PLANE (85h/80h-11h) with Plane 0 page data." For example, the command sequence for plane 510-*a* and the command sequence for the plane 515-*a* can be the same command sequence (e.g., include the same address).

In some examples, the command "Issue PROGRAM PAGE MULTI-PLANE (85h/80h-11h) with Plane 1 page data" can be associated with the plane 520-*a*. The command "Issue PROGRAM PAGE MULTI-PLANE (85h/80h-10h) with Plane 2 page data" can be associated with the plane 525-*a*. In such cases, the command of the plane 520-*a* and the command of the plane 525-*a* cannot be duplicated to replace the command of plane 510-*a*. In other examples, the command of the plane 520-*a* and the command of the plane 525-*a* can be duplicated to replace the command of the plane 510-*a*.

When the NAND controller receives a multi-plane sequence of TABLE 1, the NAND controller can trigger a program operation after the NAND controller receives the "Issue PROGRAM PAGE MULTI-PLANE (85h/80h-10h) with Plane 2 page data" command sequence (e.g., command sequence of the plane 525-*a*). In such cases, the NAND controller can utilize the last command sequence to trigger the program operation. In some cases, the command sequence for the plane 510-*a*, the plane 515-*a*, and the plane 515-*c* can be queued (e.g., saved on a local buffer) until the command sequence for the plane 525-*a* is received. The NAND controller can decode the address within the command sequence to identify an address location to overwrite original data of the block of data.

In some cases, a single descriptor can be issued for the program operation. If we duplicate the address of the plane 515-*a*, the plane 520-*a*, or the plane 525-*a* to replace the address of the plane 510-*a*, the flash controller can issue a single descriptor because each command sequence is associated with an address of a valid plane. If a command sequence can be associated with an address of an invalid plane, the flash controller cannot issue a single descriptor, rather the flash controller can issue individual descriptors for each command sequence. Issuing individual descriptors for each command sequence can increase processing times and increase the latency of the program operation.

In some cases, the command sequence can be associated with an erase operation. Table 2 can provide the command sequences for a 3-plane erase operation.

TABLE 2

| Command Sequence | Description |
| --- | --- |
| 1. Issue ERASE BLOCK MULTI-PLANE (60 h-D1 h) with Plane 0<br>2. wait tDBSY<br>1. Issue ERASE BLOCK MULTI-PIANE (60 h-D1 h) with Plane 0<br>2. wait tDBSY<br>1 issue ERASE BLOCK MULTI-PLANE (60 h-D1 h) with Plane 1<br>2. wait tDBSY<br>1. Issue ERASE BLOCK (60 h-D0 h) with Plane 2<br>2. wait tDBSY | Descriptor #1 |

In some cases, the command "Issue ERASE BLOCK MULTI-PLANE (60h-D1h) with Plane 0" can be associated with the plane 515-*a*, In such cases, the command can be duplicated, and the command of the plane 510-*a* can be replaced with "Issue ERASE BLOCK MULTI-PLANE (60h-D1h) with Plane 0." For example, the command sequence for the plane 510-*a* and the command sequence for the plane 515-*a* can be the same command sequence (e.g., include the same address).

In some examples, the command "Issue ERASE BLOCK MULII-PLANE (60h-D1h) with Plane 1" can be associated with the plane 520-*a*. The command "Issue ERASE BLOCK (60h-D0h) with Plane 2" can be associated with the plane 525-*a*. In such cases, the command of the plane 520-*a* and the command of the plane 525-*a* cannot be duplicated to replace the command of the plane 510-*a*. In other examples, the command of the plane 520-*a* and the command of the plane 525-*a* can be duplicated to replace the command of the plane 510-*a*.

When the NAND controller receives a multi-plane sequence of TABLE 2, the NAND controller can trigger an erase operation after the NAND controller receives the "Issue ERASE BLOCK (60h-D0h) with Plane 2" command sequence (e.g., command sequence of the plane 525-*a*). In such cases, the NAND controller can utilize the last command sequence to trigger the erase operation. In some cases, the command sequence for the plane 510-*a*, the plane 515-*a*, and the plane 515-*c* can be queued (e.g., saved on a local buffer) until the command sequence for the plane 525-*a* is received. Duplicating the command of the plane 515-*a* cannot cause a delay because the NAND controller cannot issue the erase operation until the command sequence for the plane 525-*a* is received. The NAND controller can decode the address within the command sequence to identify an address location to erase data of the block of data.

In some cases, a single descriptor can be issued for the erase operation. If we duplicate the address of the plane 515-*a*, the plane 520-*a*, or the plane 525-*a* to replace the address of the plane 510-*a*, the flash controller can issue a single descriptor because each command sequence is associated with an address of a valid plane. If a command sequence can be associated with an address of an invalid plane, the flash controller cannot issue a single descriptor rather the flash controller can issue individual descriptors for each command sequence. Issuing individual descriptors for each command sequence can increase processing times and increase the latency of the erase operation.

Figure 5B:
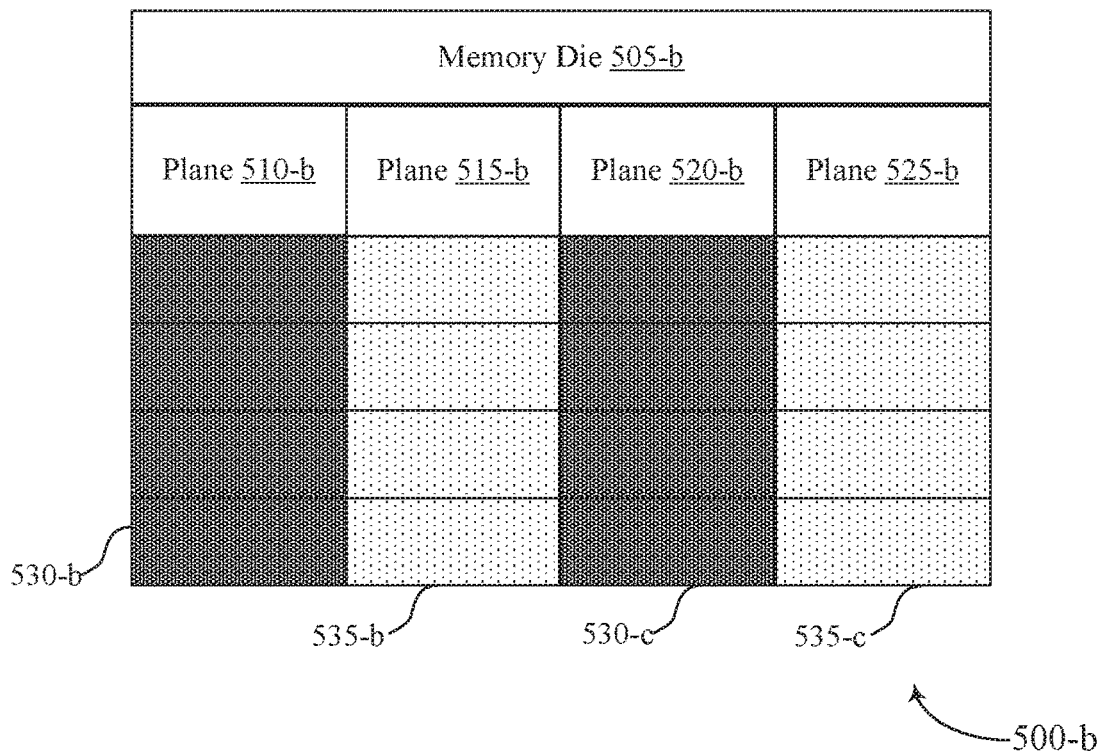
FIG. 5B is an example memory sub-system that supports full multi-plane operation enablement for memory in accordance with some examples of the present disclosure.

FIG. 5B is an example memory sub-system 500-*b* that supports full multi-plane operation enablement for memory in accordance with some examples of the present disclosure. The memory sub-system 500-*b* can include a memory die 505-*b* where the memory die 505-*b* can include a plane 510-*b*, a plane 515-*b*, a plane 520-*b*, and a plane 525-*b*. Each plane can include a block of data. For example, the plane 510-*b* includes block of data 530-*b*, and the plane 515-*b* includes block of data 535-*b*.

The memory die 505-*b* can be an example of a memory die 505-*b* that includes more than one invalid plane (e.g., the plane 510-*b* and the plane 520-*b*). The memory die 505-*b* can include valid planes (e.g., the plane 515-*b* and the plane 525-*b*). The plane 510-*b* and the plane 520-*b* can prevent the memory die 505-*b* from performing a multi-plane operation using a single descriptor due to the presence of invalid data within the block of data 530-*b* and the block of data 530-*c*. In some cases, at least one block of data 530-*b* and block of data 530-*c* that includes invalid data can result in the plane 510-*b* and the plane 520-*b*, respectively, being an invalid plane.

In such cases, the flash controller can duplicate a command associated with the valid planes and replace a command of the invalid planes with the duplicated command of the valid planes. For example, the command of the plane 515-*b* can be duplicated, and the command of the plane 510-*b* can be replaced with the command of the plane 515-*b*. The command of the plane 525-*b* can be duplicated, and the command of the plane 520-*b* can be replaced with the command of the plane 525-*b*. In some cases, the command of the plane 525-*b* can be duplicated, and the command of the plane 510-*b* can be replaced with the command of the plane 525-*b*. In other examples, the command of the plane 515-*b* can be duplicated, and the command of the plane 520-*b* can be replaced with the command of the plane 515-*b*. Table 3 can provide the command sequences for a 2-plane program operation.

TABLE 3

| Command Sequence | Description |
| --- | --- |
| 1. Issue PROGRAM PAGE MULTI-PLANE (85 h/80 h-11 h) with Plane 0 page data<br>2. wait tDBSY<br>1. Issue PROGRAM PAGE MULTI-PLANE (85 h/80 h-11 h) with Plane 0 page data<br>2. wait tDBSY<br>1 Issue PROGRAM PAGE MULTI-PLANE | Descriptor #1 |

TABLE 3-continued

| Command Sequence | Description |
| --- | --- |
| (85 h/80 h-10 h) with Plane 2 page data<br>2. wait tDBSY<br>1. Issue PROGRAM PAGE MULTI-PLANE (85 h/80 h-10 h) with Plane 2 page data<br>2. wait tDBS Y | |

In some cases, the command "Issue PROGRAM PAGE MULTI-PLANE (85h/80h-11h) with Plane 0 page data" can be associated with the plane 515-*b* In such cases, the command can be duplicated, and the command of the plane 510-*b* can be replaced with "Issue PROGRAM PAGE MULTI-PLANE (85h/80h-11h) with Plane 0 page data." For example, the command sequence for the plane 510-*b* and the command sequence for the plane 515-*b* can be the same command sequence e.g., include the same address).

In some cases, the command "Issue PROGRAM PAGE MULTI-PLANE (85h/80h-10h) with Plane 2 page data" can be associated with the plane 525-*b* In such cases, the command can be duplicated, and the command of the plane 520-*b* can be replaced with "Issue PROGRAM PAGE MULTI-PLANE (85h/80h-10h) with Plane 2 page data." For example, the command sequence for plane 520-*b* and the command sequence for the plane 525-*b* can be the same command sequence (e.g., include the same address).

When the NAND controller receives a multi-plane sequence of TABLE 3, the NAND controller can trigger a program operation after the NAND controller receives the "Issue PROGRAM PAGE MULTI-PLANE (85h/80h-10h) with Plane 2 page data" command sequence (e.g., command sequence of the plane 525-*b*). The NAND controller can identity that the command sequence associated with the plane 520-*b* is a duplicated command sequence, thereby indicating that the command sequence of the plane 520-*b* cannot be the last command sequence. In such cases, the NAND controller can refrain from issuing the program operation. In some cases, the command sequence for the plane 510-*b*, the plane 515-*b*, and the plane 520-*b* can be queued (e.g., saved on a local buffer) until the command sequence for the plane 525-*b* is received.

In some cases, a single descriptor can be issued for the program operation. If we duplicate the address of the plane 515-*b* to replace the address of the plane 510-*b* and duplicate the address of the plane 520-*b* to replace the address of the plane 525-*b*, the flash controller can issue a single descriptor because each command sequence is associated with an address of a valid plane. If at least one command sequence can be associated with an address of an invalid plane, the flash controller cannot issue a single descriptor rather the flash controller can issue individual descriptors for each command sequence. Issuing individual descriptors for each command sequence can increase processing times and increase the latency of the program operation.

In some cases, the command sequence can be associated with an erase operation. Table 4 can provide the command sequences for a 2-plane erase operation.

TABLE 4

| Command Sequence | Description |
| --- | --- |
| 1. Issue ERASE BLOCK MULTI-PIANE (60 h-D1 h) with Plane 0<br>2. wait tDBSY<br>1. Issue ERASE BLOCK MULTI-PLANE | Descriptor #1 |

TABLE 4-continued

| Command Sequence | Description |
| --- | --- |
| (60 h-D1 h) with Plane 0<br>2. wait tDBSY<br>1. Issue ERASE BLOCK (60 h-D0 h) with Plane 2<br>2. wait tDBSY<br>1. Issue ERASE BLOCK (60 h-D0 h) with Plane 2<br>2. wait tDBSY | |

In some cases, the command "Issue ERASE BLOCK MULTI-PLANE (60h-D1h) with Plane 0" can be associated with the plane 515-b, In such cases, the command can be duplicated, and the command of the plane 510-b can be replaced with "Issue ERASE BLOCK MULTI-PLANE (60h-D1h) with Plane 0." For example, the command sequence for the plane 510-b and the command sequence for the plane 515-b can be the same command sequence (e.g., include the same address).

In some cases, the command "Issue ERASE BLOCK (60h-D0h) with Plane 2" can be associated with the plane 525-b. In such cases, the command can be duplicated, and the command of the plane 520-b can be replaced with "Issue ERASE BLOCK (60h-D0h) with Plane 2," For example, the command sequence for the plane 520-b and the command sequence for the plane 525-b can be the same command sequence (e.g., include the same address).

When the NAND controller receives a multi-plane sequence of TABLE 4, the NAND controller can trigger an erase operation after the NAND controller receives the "Issue ERASE BLOCK (60h-D0h) with Plane 2" command sequence (e.g., command sequence of the plane 525-b). The NAND controller can identify that the command sequence associated with the plane 520-b is a duplicated command sequence, thereby indicating that the command sequence of the plane 520-b cannot be the last command sequence. In such cases, the NAND controller can refrain from issuing the erase operation. In some cases, the command sequence for the plane 510-b, the plane 515-b, and the plane 520-b can be queued (e.g., saved on a local buffer) until the command sequence for plane 525-b is received.

In some cases, a single descriptor can be issued for the erase operation. If we duplicate the address of the plane 515-b to replace the address of the plane 510-b and duplicate the address of the plane 520-b to replace the address of the plane 525-b, the flash controller can issue a single descriptor because each command sequence is associated with an address of a valid plane. If at least one command sequence can be associated with an address of an invalid plane, the flash controller cannot issue a single descriptor rather the flash controller can issue individual descriptors for each command sequence. Issuing individual descriptors for each command sequence can increase processing times and increase the latency of the erase operation.

In some examples, the flash controller can determine a number of invalid planes of the set of planes of the memory die 505-b and duplicate the command of a valid plane based on the number of invalid planes. For example, the flash controller can determine that the plane 510-b and the plane 520-b can are invalid planes. In such cases, the command of the plane 515-b (e.g., the valid plane) can be duplicated twice and replace each address of the command associated with the plane 510-b and the plane 520-b. In other examples, the command of the plane 525-b (e.g., the valid plane) can be duplicated twice and replace each address of the command associated with the plane 510-b and the plane 520-b. The average percentage of multi-plane blocks for a 4-plane operation can be 94.051%. The average percentage of multi-plane blocks for a 3-plane operation can be 5.809%. The average percentage of multi-plane blocks for a 2-plane operation can be 0.139%. The average percentage of multi-plane blocks for a 2-plane operation can be 0.000661%. Thus, duplicating the command of the valid plane based on the number of invalid planes can increase the efficiency and performance of the memory die 505-b.

Figure 6:
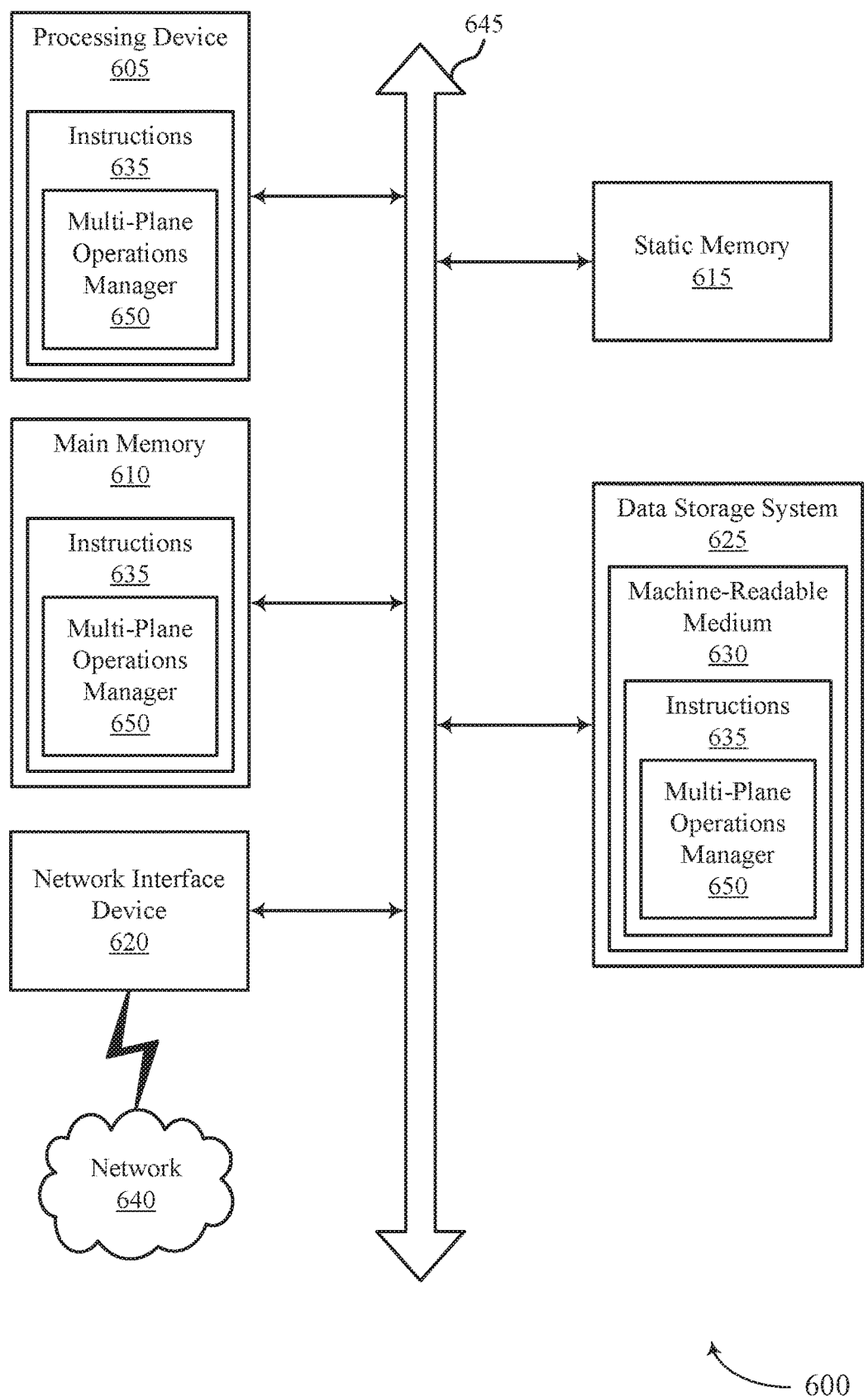
FIG. 6 is a block diagram of an example system that supports full multi-plane operation enablement for memory in accordance with some examples of the present disclosure.

FIG. 6 illustrates an example machine of a computer system 600 that supports a folding scoreboard for maintaining sequentiality in accordance with examples as disclosed herein. The computer system 600 can include a set of instructions, for causing the machine to perform any one or more of the techniques described herein. In some examples, the computer system 600 can correspond to a host system (e.g., the host system 105 described with reference to FIG. 1) that includes, is coupled with, or utilizes a memory sub-system (e.g., the memory sub-system 110 described with reference to FIG. 1) or can be used to perform the operations of a controller (e.g., to execute an operating system to perform operations corresponding to the multi-plane operations manager 150 described with reference to FIG. 1). In some examples, the machine can be connected (e.g., networked) with other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" can also include any collection of machines that individually or jointly execute a set (or multiple sets) of instructions to perform any one or more of the methodologies discussed herein.

The example computer system 600 can include a processing device 605, a main memory 610 (e.g., ROM, flash memory, DRAM such as SDRAM or Rambus DRAM (RDRAM), etc.), a static memory 615 (e.g., flash memory, static RAM (SRAM), etc.), and a data storage system 625, which communicate with each other via a bus 645.

Processing device 605 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 605 can also be one or more special-purpose processing devices such as an ASIC, an FPGA, a DSP, network processor, or the like. The processing device 605 is configured to execute instructions 635 for performing the operations and steps discussed herein. The computer system 600 can further include a network interface device 620 to communicate over the network 640.

The data storage system 625 can include a machine-readable storage medium 630 (also known as a computer-readable medium) on which is stored one or more sets of instructions 635 or software embodying any one or more of the methodologies or functions described herein. The instructions 635 can also reside, completely or at least partially, within the main memory 610 and/or within the processing device 605 during execution thereof by the computer system 600, the main memory 610 and the processing device 605 also constituting machine-readable storage media. The machine-readable storage medium 630, data storage system 625, and/or main memory 610 can correspond to a memory sub-system.

In one example, the instructions 635 include instructions to implement functionality corresponding to a multi-plane operations manager 650 (e.g., the multi-plane operations manager 150 described with reference to FIG. 1). While the machine-readable storage medium 630 is shown as a single medium, the term "machine-readable storage medium" can include a single medium or multiple media that store the one or more sets of instructions. The term "machine-readable storage medium" can also include any medium that is capable of storing or encoding a set of instructions for execution by the machine and that cause the machine to perform any one or more of the methodologies of the present disclosure. The term "machine-readable storage medium" can include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some examples, a machine-readable (e.g., computer-readable) medium includes a machine (e.g., a computer) readable storage medium such as ROM, RAM, magnetic disk storage media, optical storage media, flash memory components, etc.

In the foregoing specification, examples of the disclosure have been described with reference to specific example examples thereof. It will be evident that various modifications can be made thereto without departing from the broader spirit and scope of examples of the disclosure as set forth in the following claims. The specification and drawings are, accordingly, to be regarded in an illustrative sense rather than a restrictive sense.

What is claimed is:

1. A method comprising:
    determining that a first plane of a set of planes of a memory die is an invalid plane; and
    issuing, based at least in part on the determining, a single descriptor associated with a multi-plane operation for the set of planes of the memory die, wherein the single descriptor comprises a command sequence for the multi-plane operation, and wherein a first command of the command sequence is a duplicate of a second command of the command sequence based at least in part on the first plane being the invalid plane, the second command for a second plane of the set of planes.

2. The method of claim 1, further comprising:
    replacing an address of the first plane with an address of the second plane of the set of planes, wherein the second plane of the set of planes is a valid plane.

3. The method of claim 2, further comprising:
    determining a number of invalid planes of the set of planes; and
    replacing addresses for each of the number of invalid planes with an address associated with a valid plane in the command sequence for the multi-plane operation indicated by the single descriptor.

4. The method of claim 1, further comprising:
    duplicating the second command of the command sequence based at least in part on the first plane being the invalid plane; and
    replacing the first command with the second command based at least in part on duplicating the second command.

5. The method of claim 1, wherein determining that the first plane of the set of planes is the invalid plane is based at least in part on the first plane containing an amount of invalid data, the first plane exceeding a threshold number of invalid pages of the memory die, or both.

6. The method of claim 1, wherein the second command corresponds to the second plane different from the first plane.

7. The method of claim 1, wherein the second command corresponds to a valid plane.

8. The method of claim 1, wherein issuing the single descriptor further comprises:
issuing the single descriptor to a local memory controller of the memory die.

9. The method of claim 1, wherein the single descriptor contains only commands for valid planes of the set of planes.

10. The method of claim 1, wherein the command sequence is associated with at least one of a read operation, a write operation, or an erase operation.

11. A method, comprising:
receiving a single descriptor associated with a multi-plane operation for a set of planes of a memory die; and
issuing a command sequence for the multi-plane operation based at least in part on receiving the single descriptor, wherein the single descriptor indicates the command sequence for the multi-plane operation, and wherein a first command of the command sequence is a duplicate of a second command of the command sequence.

12. The method of claim 11, wherein issuing the command sequence further comprises:
issuing the first command for a second plane of the set of planes, wherein the second plane is a valid plane.

13. The method of claim 12, wherein issuing the command sequence further comprises:
issuing the second command for the second plane of the set of planes.

14. The method of claim 11, wherein the second command is duplicated for the first command based at least in part on a first plane of the set of planes being an invalid plane, the first plane containing an amount of invalid data, exceeding a threshold number of invalid pages of the memory die, or both.

15. The method of claim 11, wherein the second command corresponds to a second plane different from a first plane, wherein the second command corresponds to a valid plane.

16. The method of claim 11, wherein the command sequence is associated with at least one of a read operation, a write operation, or an erase operation.

17. A system, comprising:
a plurality of memory components; and
a processing device, operatively coupled with the plurality of memory components, to:
determine that a first plane of a set of planes of a memory die is a valid plane;
duplicate a first command of a command sequence for a multi-plane operation for the set of planes based at least in part on a second plane of the set of planes being an invalid plane; and
issue, based at least in part on the determining, a single descriptor associated with the multi-plane operation, wherein the single descriptor indicates the command sequence including the first command and a duplicate of the first command.

18. The system of claim 17, further comprising:
the processing device further to:
replace an address within a command for the second plane with an address of the first plane.

19. The system of claim 17, further comprising:
the processing device further to:
determine a number of invalid planes of the set of planes; and
duplicate the first command based at least in part on the number of invalid planes.

20. The system of claim 17, wherein the command sequence is associated with valid planes of the set of planes.

* * * * *